US009632378B2

(12) United States Patent
Abe et al.

(10) Patent No.: US 9,632,378 B2
(45) Date of Patent: Apr. 25, 2017

(54) DISPLAY DEVICE

(71) Applicant: Japan Display Inc., Tokyo (JP)

(72) Inventors: Hiroyuki Abe, Chiba (JP); Masahiro Maki, Mobara (JP); Tomonori Nishino, Mobara (JP)

(73) Assignee: Japan Display Inc., Tokyo (JP)

( * ) Notice: Subject to any disclaimer, the term of this patent is extended or adjusted under 35 U.S.C. 154(b) by 82 days.

(21) Appl. No.: 13/645,651

(22) Filed: Oct. 5, 2012

(65) Prior Publication Data

US 2013/0148049 A1    Jun. 13, 2013

(30) Foreign Application Priority Data

Oct. 6, 2011  (JP) .................. 2011-221544

(51) Int. Cl.
| | | |
|---|---|---|
| G02F 1/1343 | (2006.01) | |
| G02F 1/1362 | (2006.01) | |
| H01L 29/786 | (2006.01) | |
| G02F 1/1333 | (2006.01) | |
| H01L 27/12 | (2006.01) | |

(52) U.S. Cl.
CPC .. *G02F 1/136286* (2013.01); *G02F 1/136204* (2013.01); *H01L 29/78651* (2013.01); *G02F 2001/133388* (2013.01); *H01L 27/1214* (2013.01)

(58) Field of Classification Search
CPC ......... G02F 1/136286; G02F 1/136204; G02F 2001/133388; H01L 29/78651; H01L 27/1214; G09G 3/3674; G09G 3/3677

USPC .......................... 349/40, 43, 54, 58
See application file for complete search history.

(56) References Cited

U.S. PATENT DOCUMENTS

| | | | | |
|---|---|---|---|---|
| 5,673,127 | A * | 9/1997 | Takahara et al. ............. 349/140 |
| 5,969,782 | A * | 10/1999 | Lee et al. ...................... 349/141 |
| 2003/0231149 | A1* | 12/2003 | Kawamura et al. ............ 345/76 |
| 2008/0123005 | A1* | 5/2008 | Sohn et al. ...................... 349/40 |
| 2010/0097538 | A1 | 4/2010 | Ota |
| 2011/0278576 | A1* | 11/2011 | Guo ................... G02F 1/136286 257/59 |

FOREIGN PATENT DOCUMENTS

| | | |
|---|---|---|
| JP | H07-333654 A | 12/1995 |
| JP | 9-5780 | 1/1997 |
| JP | 2002-214643 A | 7/2002 |

(Continued)

OTHER PUBLICATIONS

Office Action dated Jun. 30, 2015 regarding a corresponding Japanese Patent Application No. 2011-221544.

(Continued)

*Primary Examiner* — Edward Glick
*Assistant Examiner* — David Chung
(74) *Attorney, Agent, or Firm* — Typha IP LLC (57) ABSTRACT

A display device includes a display area as an area having a plurality pixels each including a thin film transistor, and adapted to display an image, and a dummy pixel area formed outside the display area, and having a plurality of dummy pixels. The dummy pixel includes a dummy gate signal line parallel to a gate signal line of the thin film transistor, and a semiconductor layer intersecting with the dummy gate signal line via an insulating layer. Just one conductor layer is connected to the semiconductor layer.

17 Claims, 10 Drawing Sheets

(56) References Cited

FOREIGN PATENT DOCUMENTS

| | | |
|---|---|---|
| JP | 2005-084430 A | 3/2005 |
| JP | 2007-093685 A | 4/2007 |
| JP | 2010-97024 | 4/2010 |
| JP | 2011-158872 A | 8/2011 |

OTHER PUBLICATIONS

Japanese Office Action dated Feb. 2, 2016, for corresponding Japanese Patent Application No. 2011-221544.

* cited by examiner

DISPLAY DEVICE

CROSS-REFERENCE TO RELATED APPLICATION

The present application claims priority from Japanese application JP2011-221544 filed on Oct. 6, 2011, the content of which is hereby incorporated by reference into this application.

BACKGROUND OF THE INVENTION

1. Field of the Invention

The present invention relates to a display device, and in particular to a display device using a thin film transistor substrate.

2. Description of the Related Art

As a display device of an information communication terminal such as a computer and a television receiver, a liquid crystal display device is used widely. Further, an organic EL display device (OLED), a field emission display device (FED), and so on are also known as thin display devices. The liquid crystal display device is a device for displaying an image by varying the orientation of liquid crystal components, which are encapsulated between two substrates, using the variation in the electrical field to thereby control the level of the permeability of the light transmitted through the two substrates and the liquid crystal components.

In the display devices, which apply voltages corresponding to predetermined grayscale values to respective pixels of a screen, including such a liquid crystal display device, there are arranged thin film transistors for applying the voltages corresponding to the grayscale values to the respective pixels. In general, gates of the thin film transistors of the respective pixels corresponding to one line of the screen are connected to a single signal line (hereinafter referred to as a "gate signal line"), and a drive circuit is controlled to output voltages, which set the respective thin film transistors to a conductive state, sequentially to the gate signal line. Further, at an end portion of a display area, there are arranged dummy pixels outside the display area so that the structural and electromagnetic variation due to the fact that the end portion is located at the end of the display area does not affect the display.

JP 2010-097024 A discloses that switching elements are arranged outside the display area, and even in the case in which a static electrical charge occurs, the switching elements are broken to thereby protect the elements inside the display area.

JP 09-005780 A discloses that nondisplay pixels are arranged outside the display area, and pixel electrodes of one or more columns are eliminated so as not to cause the luminance variation in display and not to degrade the sealing performance of the liquid crystal in the liquid crystal display device.

Figure 11:
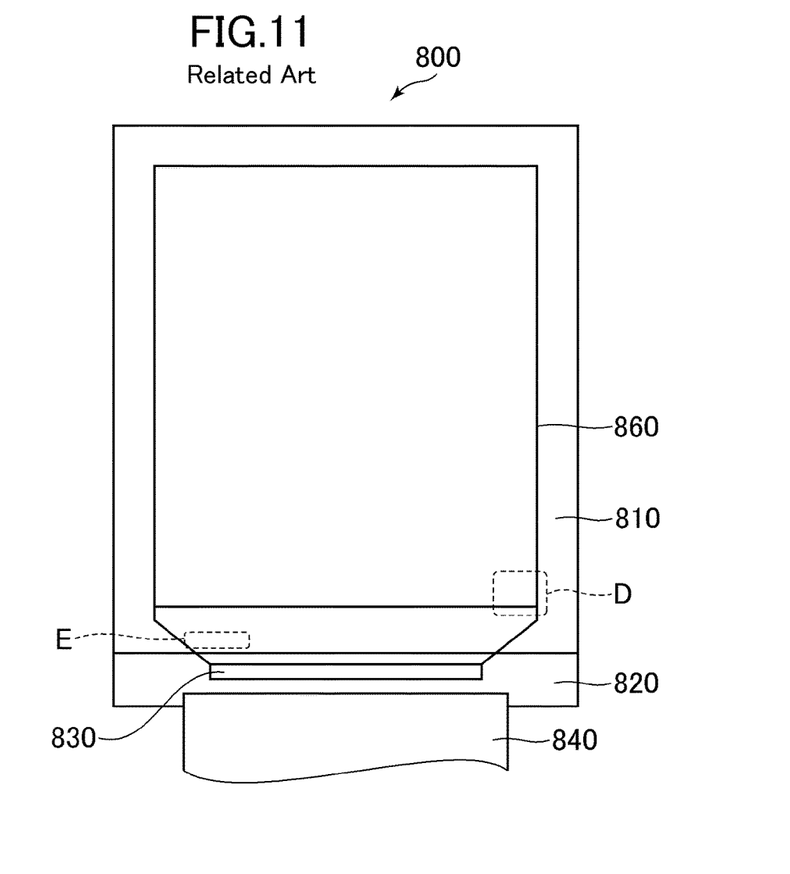
FIG. 11 is a diagram corresponding to a field of vision from the front of a liquid crystal display panel.

Due to the demand of downsizing to electronic apparatuses in recent years, it is requested to reduce an outside area (hereinafter referred to as a "frame area") of the display area. FIG. 11 is a diagram corresponding to a field of vision from the front of a liquid crystal display panel 800. The liquid crystal display panel 800 has a configuration in which a liquid crystal is encapsulated between a color filter substrate 810 and a thin film transistor (TFT) substrate 820, and is attached with a drive integrated circuit (IC) 830 for operating a circuit of the TFT substrate 820, and a flexible printed circuit (FPC) 840 for transmitting, for example, information of an image to be displayed to the drive IC 830.

Figure 12:
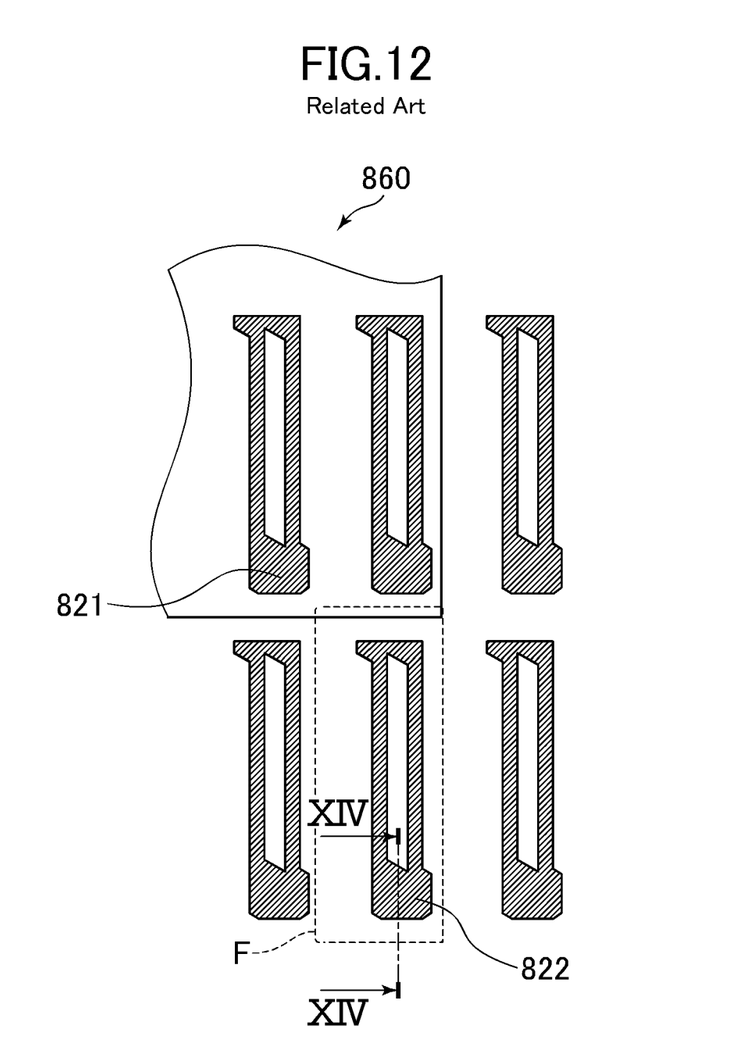
FIG. 12 is a schematic diagram schematically showing a D part of FIG. 11.
Figure 13:
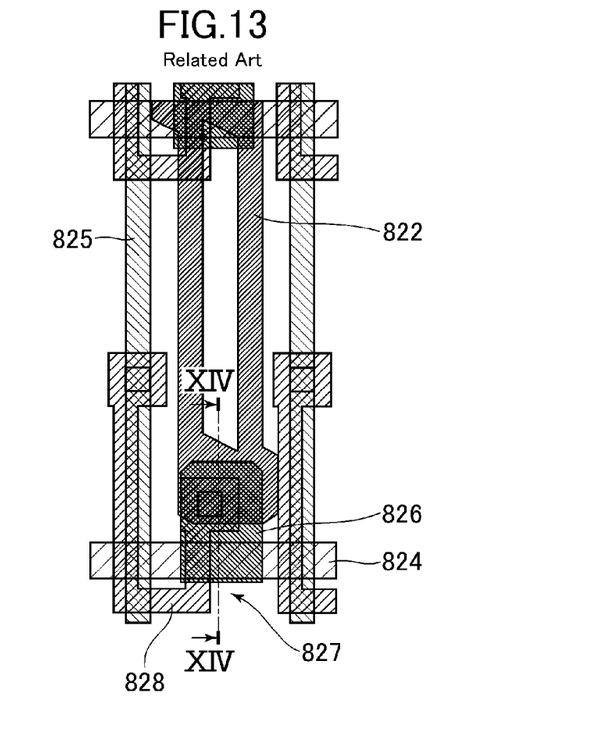
FIG. 13 is a diagram schematically showing the state of wiring in an F part of FIG. 12.
Figure 14:
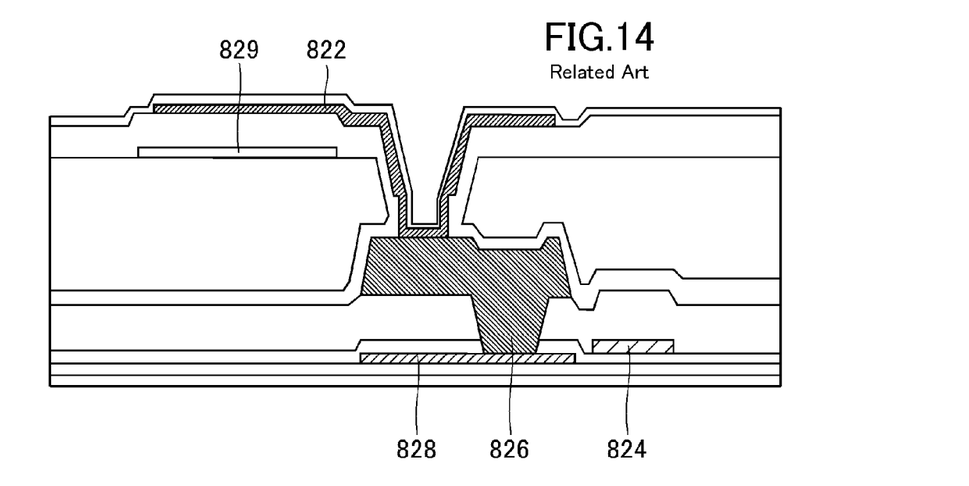
FIG. 14 is a cross-sectional view along the XIV-XIV line shown in FIG. 12.
Figure 15:
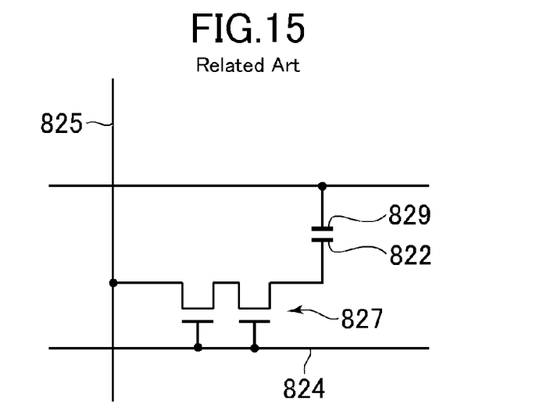
FIG. 15 is a circuit diagram of an equivalent circuit of a dummy pixel circuit.

FIG. 12 is a schematic diagram schematically showing a D part shown in FIG. 11, and shows a pixel electrode 821 inside a display area, and the state of the arrangement of dummy pixel electrodes 822 of respective dummy pixels outside the display area. FIG. 13 is a diagram schematically showing the state of the arrangement of the wiring of the dummy electrodes 822 and the periphery thereof in an F part shown in FIG. 12. As shown in FIG. 13, similarly to the pixel electrodes inside the display area, in the dummy pixels, the pixel is composed of a gate signal line 824 and an image data signal line 825, and the image data signal line 825 is connected to the dummy pixel electrode 822 via a tin film transistor 827. FIG. 14 is a cross-sectional view along the XIV-XIV line shown in FIG. 12. In the example shown in the drawing, the dummy pixel electrode 822 has a similar size to the pixel electrode 821 located inside the display area, and is arranged to be conductive with the image data signal line 825 when the gate signal line 824 is set to a High potential, and is arranged to be able to perform a similar operation to that in a display area 860. FIG. 15 shows an equivalent circuit in this case. A signal voltage transmitted through the image data signal line 825 is applied to the dummy pixel electrode 822, and causes an electrical potential difference with a common electrode 829.

However, also in the display device requiring such dummy pixels, a display device with a smaller frame is demanded, and further, for the sake of convenience of the operation of a gate signal drive circuit (not shown), it may become necessary to dispose a plurality of the gate signal lines 824 on the upper and lower outsides of the display area in some cases.

SUMMARY OF THE INVENTION

The present invention is made in view of the circumstances described above, and has an object of providing a display device having dummy pixels for preventing an electrostatic discharge (ESD) damage due to a static electrical charge generated in, for example, a manufacturing process while reducing the size of a frame area.

A display device according to an aspect of the present invention includes a display area as an area having a plurality of pixels each including a thin film transistor, and adapted to display an image, and a dummy pixel area formed outside the display area, and having a plurality of dummy pixels, the dummy pixel includes a dummy gate signal line parallel to a gate signal line of the thin film transistor, and a semiconductor layer intersecting with the dummy gate signal line via an insulating layer, and just one conductor layer is connected to the semiconductor layer.

Here, the terms of "display area" and "dummy pixel area" are defined in a field of vision perpendicular to the display surface. Further, the description of "just one conductor layer is connected to the semiconductor layer" means that when considering a transistor, only either one of a source and a drain is electrically connected, and the other thereof is not connected.

Further, in the display device according to the present invention, it is possible that the just one conductor layer is an image data signal line to which image data to be displayed in the display area is applied.

Further, in the display device according to the present invention, it is possible that the dummy gate signal line is formed in a same layer as the gate signal line of the thin film transistor in the display area so as to have a same width as the gate signal line of the thin film transistor in the display area, and the semiconductor layer of the dummy pixel is formed in a same layer as a semiconductor layer of the thin film transistor in the display area so as to have a same width as the semiconductor layer of the thin film transistor in the display area in a part in which the semiconductor layer of the dummy pixel intersects with the dummy gate signal line.

Further, in the display device according to the present invention, it is possible that in a field of vision perpendicular to the display surface of the display area, an area of a region where the dummy pixel is formed is smaller than an area of a region where the thin film transistor is formed in the display area.

Further, in the display device according to the present invention, it is possible that the dummy pixel area further includes a dummy pixel electrode formed in a same layer as a pixel electrode to which an image data signal is applied via the thin film transistor in the pixel in the display area, and the dummy pixel electrode is electrically connected to a common electrode forming a pair with the pixel electrode to control an orientation of a liquid crystal.

Further, in the display device according to the present invention, it is possible that the semiconductor layer of the thin film transistor and the dummy pixel is formed of low-temperature polysilicon.

Further, in the display device according to the present invention, it is possible that the orientation of the liquid crystal is controlled using an in-plane switching (IPS) method.

DETAILED DESCRIPTION OF THE INVENTION

Hereinafter, first and second embodiments of the present invention will be explained with reference to the accompanying drawings. It should be noted that in the drawings, the same or equivalent elements will be denoted with the same reference symbols, and redundant explanations will be omitted.

[First Embodiment]

Figure 1:
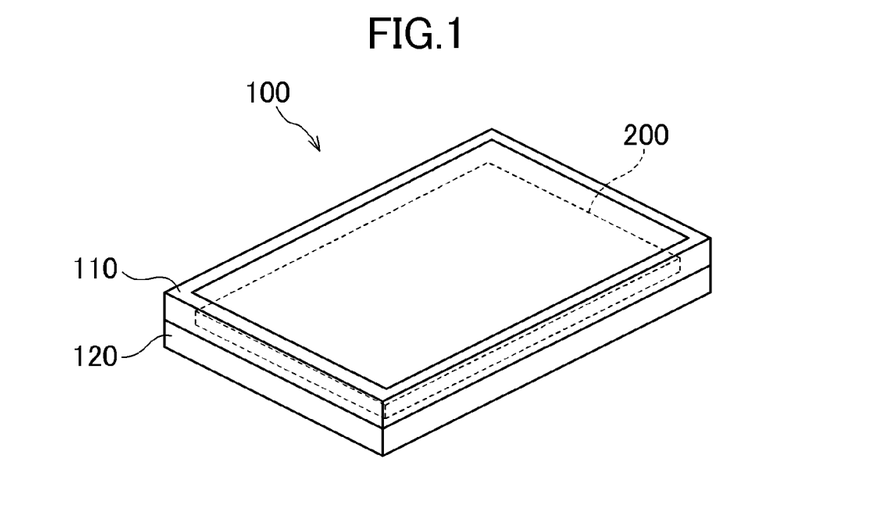
FIG. 1 is a diagram schematically showing a display device according to a first embodiment of the present invention.

FIG. 1 schematically shows a display device 100 according to the first embodiment of the present invention. As shown in the drawing, the display device 100 is composed of a display panel 200 fixed so as to be sandwiched between an upper frame 110 and a lower frame 120 and so on. It should be noted that the display panel 200 can be any display panel such as a liquid crystal display panel or an organic EL display panel providing the display panel uses a thin film transistor substrate. In the present embodiment, it is assumed that the display panel 200 is the liquid crystal display panel.

Figure 2:
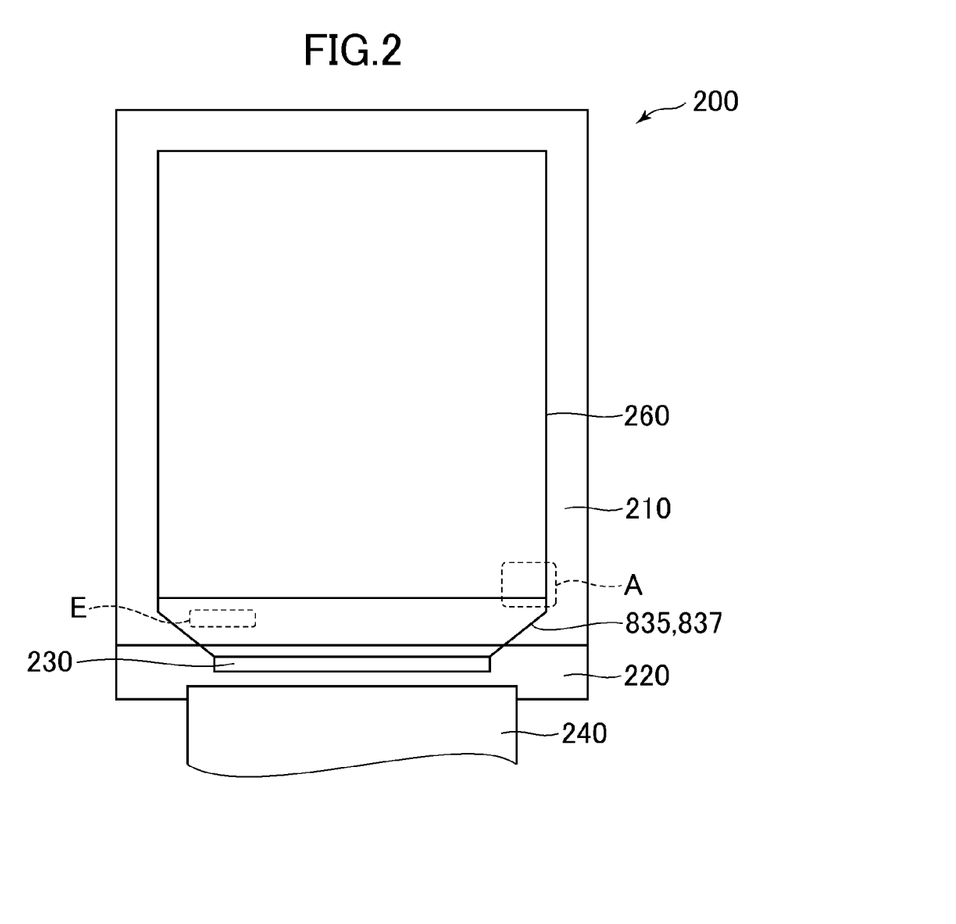
FIG. 2 is a diagram corresponding to a field of vision from the front of a display panel shown in FIG. 1.

FIG. 2 is a diagram corresponding to a field of vision from the front of the display panel 200. The liquid crystal display panel 200 has a configuration in which a liquid crystal is encapsulated between a color filter substrate 210 and a thin film transistor (hereinafter referred to as TFT) substrate 220, and is attached with a drive integrated circuit (IC) 230 for operating a circuit of the TFT substrate 220, and a flexible printed circuit (FPC) 240 for transmitting, for example, information of an image to be displayed to the drive IC 230 from the outside.

Figure 16:
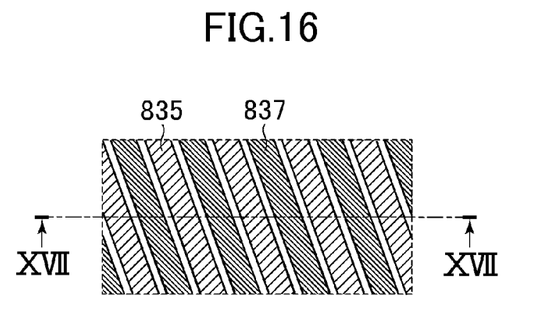
FIG. 16 is a diagram showing the state of wiring of image data signal lines (drain lines) in an E part of FIG. 2.
Figure 17:
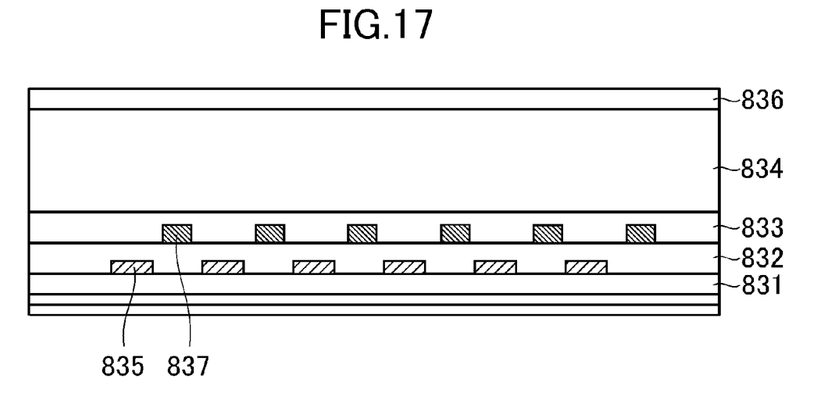
FIG. 17 is a cross-sectional view along the XVII-XVII line shown in FIG. 16.

FIG. 16 is a diagram showing the state of extraction wiring lines 835, 837 extending obliquely from the drive IC 230 toward image data signal lines (drain lines) of a display area 260 in an E part of FIG. 2. FIG. 17 is a diagram showing a cross-section along the XVII-XVII line shown in FIG. 16, wherein layers of a gate insulating film 831, an interlayer insulating film 832, a protective film 833, an organic protective film 834, and a protective film 836 are formed in this order. As shown in these drawings, the extraction wiring lines 835, 837 extending from the drive IC 230 to the display area 260 have a multilayer structure because a number of lines are required to be wired for coping with the high-definition requirement in recent years.

In FIG. 17, the extraction wiring line 835 is formed of a conductive film formed in the same process as a gate signal line 311 described later, and the extraction wiring line 837 is formed of a conductive film formed in the same process as an image data signal line 312. Therefore, there arises the case in which the extraction wiring line 835 and the extraction wiring line 837 are formed of the respective conductive films different from each other. If the extraction wiring line 835 and the extraction wiring line 837 are formed of the respective conductive films different from each other, it results that the extraction wiring lines adjacent to each other are different from each other in resistance and capacitance. Further, a gate signal line in a dummy pixel located outside the display area is formed closer to the extraction wiring than a gate signal line located inside the display area, and is therefore easily affected by the difference in capacitance and resistance between the extraction wiring lines. Therefore, in the case in which the difference in capacitance and resistance is caused between the extraction wiring lines, there might occur an ESD damage in the periphery of the gate signal line of the dummy pixel due to, for example, an instantaneous electrical potential difference in a manufacturing process.

Figure 3:
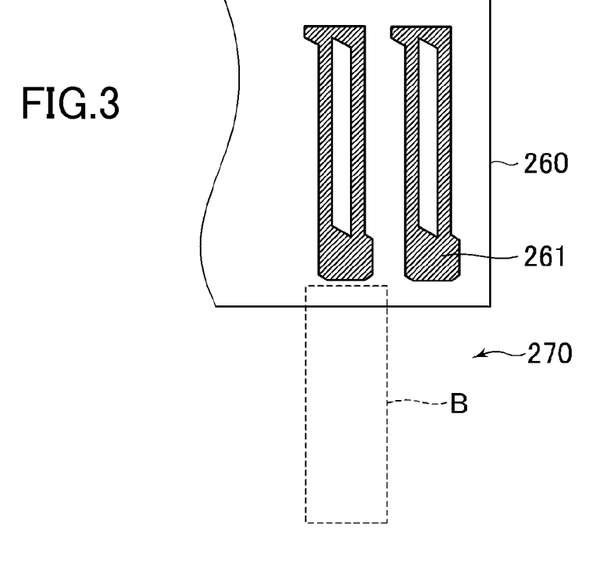
FIG. 3 is a schematic diagram schematically showing an A part of FIG. 2.

FIG. 3 is a schematic diagram schematically showing an A part of FIG. 2. As shown in this drawing, although a pixel electrode 261 is disposed inside the display area 260, no electrode corresponding to the pixel electrode 261 is disposed in a dummy pixel area 270 outside the display area.

A gate signal line drive circuit will be explained using FIG. 18. The liquid crystal display device according to the present invention is provided with a gate signal line drive circuit VDL disposed on the left of the display area 260, and a gate signal line drive circuit VDR disposed on the right thereof. The gate signal line drive circuits VDL, VDR are each a shift register circuit capable of performing bidirectional scanning, and are capable of scanning the gate signal lines from the bottom toward the top of the drawing, and scanning them from the top toward the bottom thereof.

Figure 18:
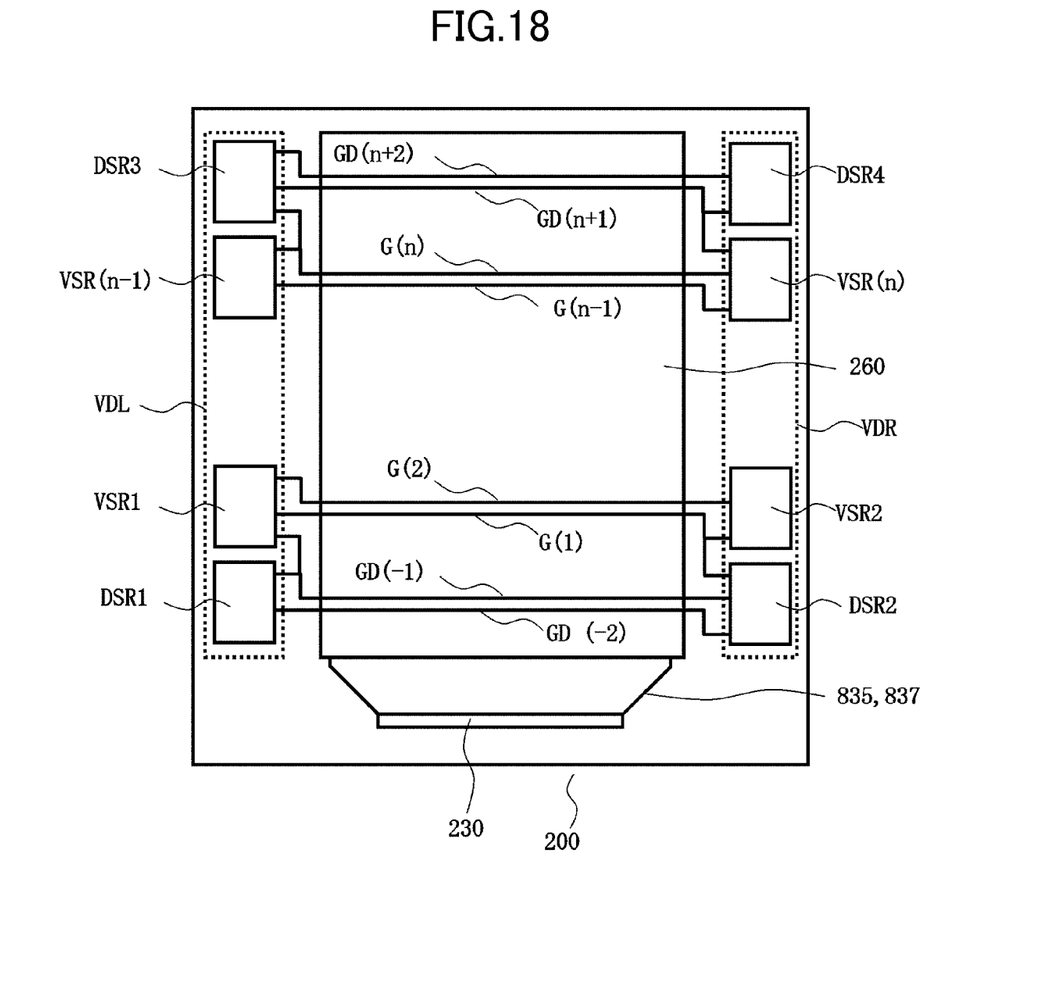
FIG. 18 is a diagram for explaining a gate signal line drive circuit.

It should be noted that in FIG. 18, the gate signal lines and dummy gate signal lines are attached with respective reference symbols in order to explain the operation of the data signal line drive circuits, and the reference symbols are different from the reference symbols of the gate signal lines used in other drawings.

The gate signal line drive circuits VDL, VDR are composed of n elementary circuits VSR1 through VSR (n), and dummy circuits DSR1, DSR2, DSR3, and DSR4. In the case of performing the scanning from the bottom toward the top in the circuit shown in FIG. 18, firstly, a scanning signal is transmitted from the dummy circuit DSR1 to the dummy circuit DSR2 via a dummy gate signal line GD(−2), and then the scanning signal is transmitted from the dummy circuit DSR2 to the elementary circuit VSR1 via a dummy gate signal line GD(−1). Subsequently, the scanning signal is transmitted sequentially from the elementary circuit VSR1 to the elementary circuit VSR(n) via gate signal lines G(1) through G(n−1), and then the scanning signal is transmitted from the elementary circuit VSR(n) to the dummy circuit DSR3 via a gate signal line G(n).

Although the elementary circuit VSR1 starts the operation in response to the output of the dummy circuit DSR2 in the previous stage, the scanning signal output is started from the dummy circuit DSR1 in the second previous state in order to adjust a signal waveform output by the dummy circuit DSR2. Therefore, two dummy signal lines are necessary in the anterior stage of the first gate signal line.

Figure 4:
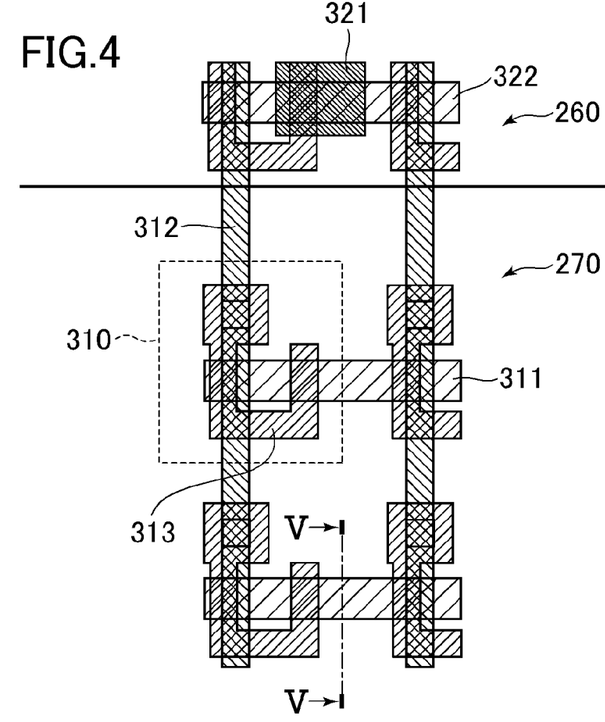
FIG. 4 is a diagram schematically showing the state of wiring in a B part of FIG. 3.

FIG. 4 is a diagram schematically showing the state of wiring in a B part of FIG. 3. As shown in FIG. 4, a dummy pixel 310 of the dummy pixel area 270 has the gate signal line 311 formed in the same layer as a gate signal line 322 of the display area 260 so as to have the same width as the gate signal line 322, the image data signal line 312 extending from the display area 260, and a semiconductor layer 313 connected to the image data signal line 312 and patterned so as to traverse two times under the gate signal line 311, wherein the semiconductor layer 313 is electrically connected only to the image data signal line 312, but is not connected to other conductor layers. In comparison with the pixel existing in the display area 260, the dummy pixel 310 is not provided with a metal wiring 321 as a conductive body for forming the connection with the source side of the semiconductor layer, and the pixel electrode 261, and is formed to have the smaller area. In other words, as shown in FIG. 4, there is adopted a configuration in which two gate signal lines 311 are disposed in the area corresponding to one pixel in the display area 260, and two dummy pixels 310 are included in the area. It should be noted that, although in the present embodiment it is assumed that the area corresponding to one pixel in the display area 260 includes two dummy pixels 310, it is also possible for the area corresponding to one pixel to include one dummy pixel, or to include three or more dummy pixels. Here, although it is desirable for the semiconductor layer 313 to be formed of low-temperature polysilicon, it is also possible for the semiconductor layer 313 to be formed of other semiconductor materials.

Figure 5:
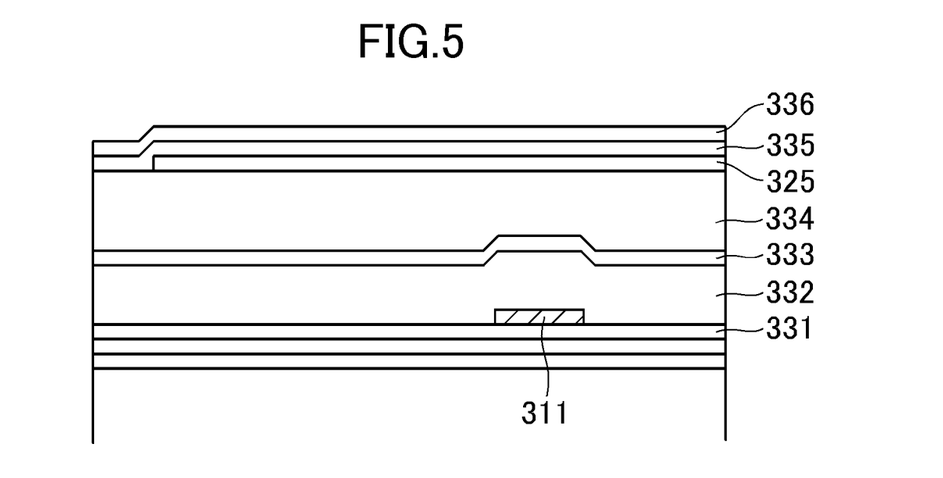
FIG. 5 is a diagram showing a cross-section along the V-V line shown in FIG. 4.

FIG. 5 shows a cross-section along the V-V line shown in FIG. 4. As shown in the drawing, layers of a gate insulating film 331, an interlayer insulating film 332, a protective film 333, an organic protective film 334, a common electrode 325, a protective film 335, and an oriented film 336 are formed in this order. In comparison with FIG. 14, there is adopted a configuration in which no conductor layer is connected to the source side of the transistor, and the pixel electrode 261 is also eliminated.

Figure 6:
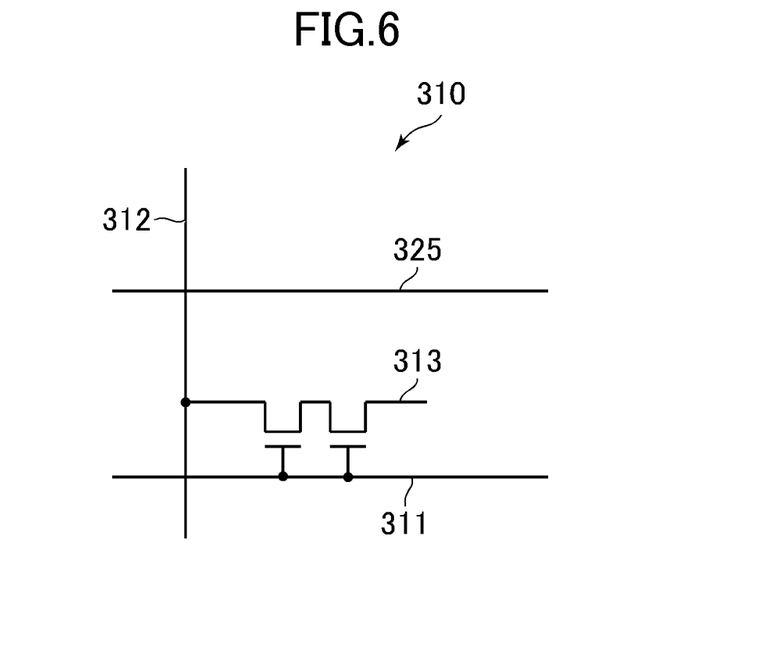
FIG. 6 is a circuit diagram of an equivalent circuit of a dummy pixel circuit.

FIG. 6 shows a circuit diagram of an equivalent circuit of the circuit of the dummy pixel 310 described above. As shown in the drawing, since the semiconductor layer 313 straddles the gate signal line 311 two times, there is formed a configuration looked as if two transistors are formed. However, there is no conductive body connected to the source side.

Therefore, according to the display device of the present embodiment, since the gate signal line 311 of the dummy pixel area 270 intersects with the semiconductor layer 313 similarly to the pixel in the display area 260, it is possible to provide a load capacitance compatible with that of the gate signal line 322 in the display area 260, and thus, the ESD damage in a manufacturing plant can be prevented. Further, according to the display device of the present embodiment, since the dummy pixel 310 is formed to be smaller than the pixel in the display area 260, it is possible to form the dummy pixel area 270, namely the frame area, to have smaller dimensions.

[Second Embodiment]

Figure 7:
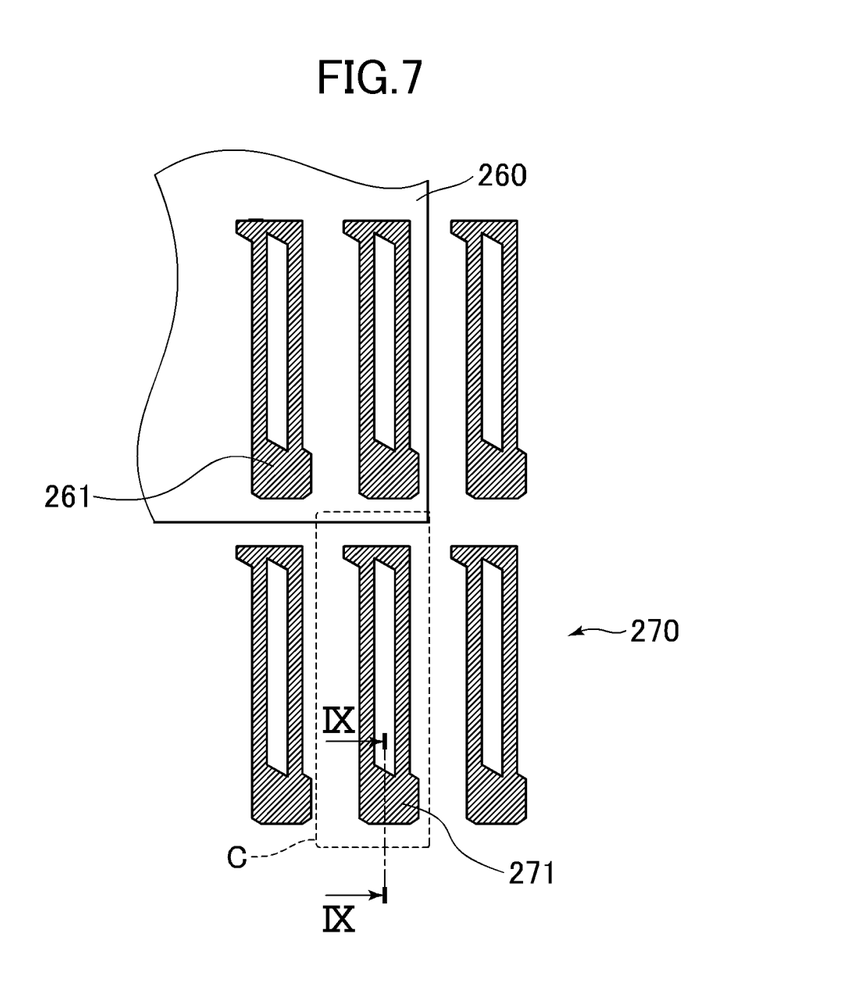
FIG. 7 is a schematic diagram schematically showing the A part of FIG. 2 in a second embodiment of the present invention.

A second embodiment of the present invention will be explained. Since the configuration of a display device according to the second embodiment is substantially the same as the configuration shown in FIGS. 1 and 2 of the first embodiment, redundant explanations will be omitted. FIG. 7 is a schematic diagram schematically showing the Apart of FIG. 2 in the second embodiment, wherein dummy pixel electrodes 271 each similar to the pixel electrode 261 in the display area 260 are also provided to the dummy pixel area 270 located outside the display area.

Figure 8:
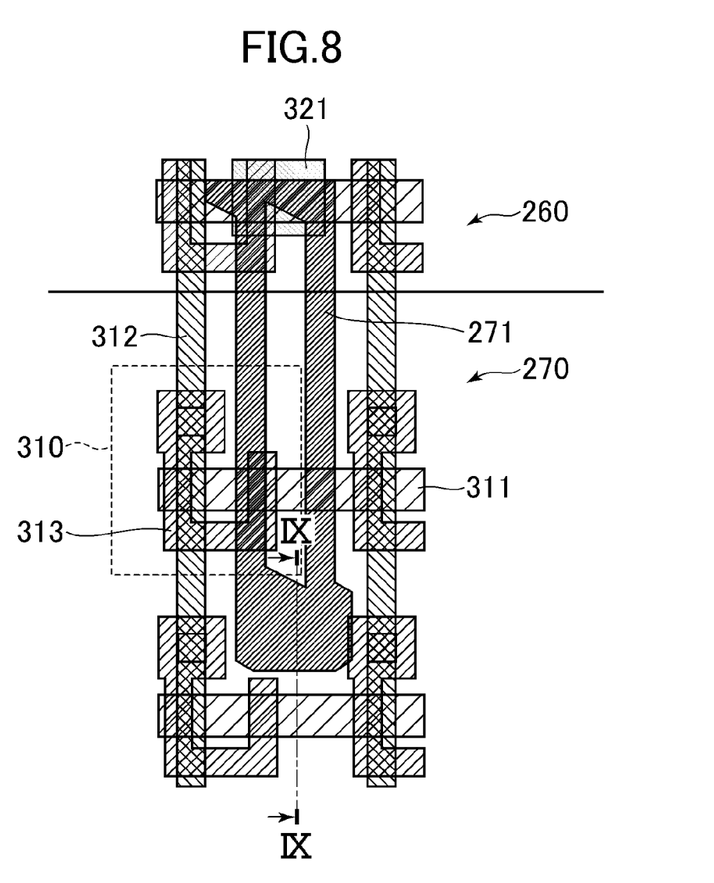
FIG. 8 is a diagram schematically showing the state of wiring in a C part of FIG. 7.

FIG. 8 is a diagram schematically showing the state of wiring in a C part of FIG. 7. Similarly to FIG. 4, in FIG. 8, the dummy pixel area 270 is provided with the dummy pixel 310, and the dummy pixel 310 has the gate signal line 311 formed in the same layer as the gate signal line in the display area 260 so as to have the same width as the gate signal line, the image data signal line 312 extending from the display area 260, and the semiconductor layer 313 connected to the image data signal line 312 and patterned so as to traverse two times under the gate signal line 311, wherein the semiconductor layer 313 is electrically connected only to the image data signal line 312, but is not connected to other conductor layers. Further, similarly to FIG. 4, also in FIG. 8, there is adopted a configuration in which two gate signal lines 311 are disposed in the area corresponding to one pixel in the display area 260, and two dummy pixels 310 are included in the area.

Here, although the dummy pixel electrode 271 is formed in the dummy pixel area 270 of the second embodiment, the dummy pixel electrode 271 is not electrically connected to the semiconductor layer 313, but is electrically connected to the common electrode 325 described later.

Figure 9:
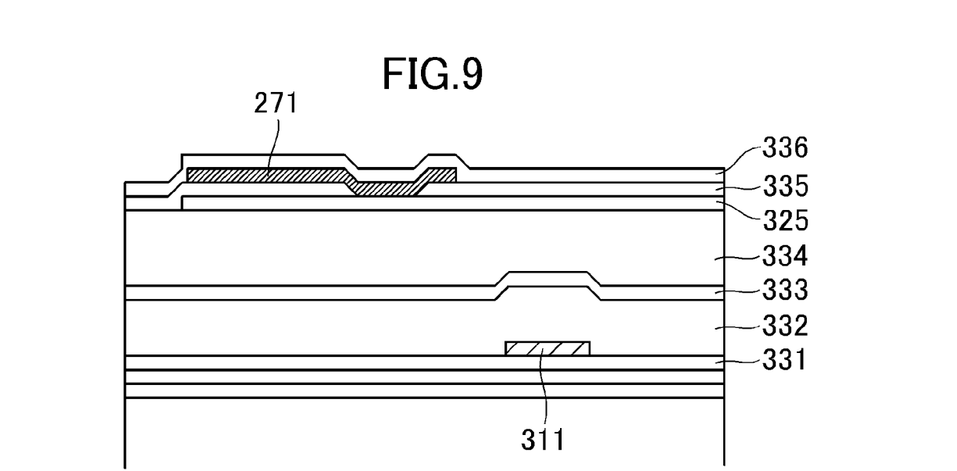
FIG. 9 is a diagram showing a cross-section along the IX-IX line shown in FIG. 8.

FIG. 9 shows a cross-section along the IX-IX line shown in FIG. 8. FIG. 9 is different from FIG. 5 in the point that the dummy pixel electrode 271 is formed, and the same as FIG. 5 in other points. As shown in this drawing, the dummy pixel electrode 271 is electrically connected to the common electrode 325, and is arranged to be prevented from getting into the electrically floating state.

Therefore, similarly to the first embodiment, according to the display device of the present embodiment, since the gate signal line 311 in the dummy pixel area 270 intersects with the semiconductor layer 313, it is possible to provide a load capacitance compatible with that of the gate signal line in the display area 260, and thus, the ESD damage in the manufacturing plant can be prevented. Further, since the dummy pixel 310 is formed to be smaller than the pixel in the display area 260, it is possible to form the dummy pixel area 270, namely the frame area, to have smaller dimensions. Further, since the dummy pixel electrode 271 is formed, uniformization of a TFT pattern shape and homogenization of the parasitic capacitance in an end portion of the display area 260 can be achieved.

Figure 10:
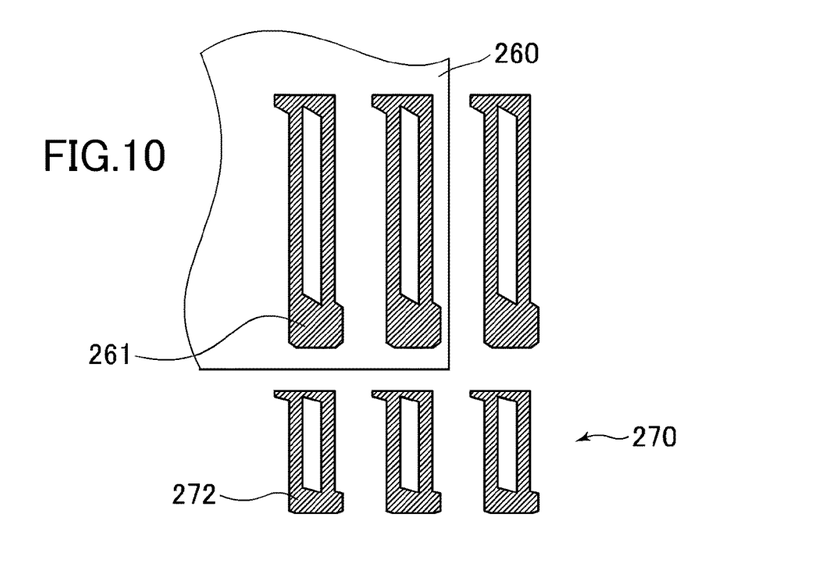
FIG. 10 is a diagram showing a modified example of the second embodiment of the present invention.

FIG. 10 shows a modified example of the second embodiment of the present invention. In this modified example, dummy pixel electrodes 272 each formed to be smaller than the dummy pixel electrode 271 shown in FIG. 7 are provided. In this case, by forming the dummy pixels 310 in just one line outside the display area 260, the frame area can further be reduced.

It should be noted that the display device according to any one of the embodiments described above can be used for a display device of forming the thin film transistors in the respective pixels such as an organic EL display device or a field emission display device (FED) besides the liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a display area including a plurality of pixels each including a thin film transistor, and configured to display an image;
   a dummy pixel area formed outside the display area, and including a plurality of dummy pixels,
   a gate signal line electrically connected to a gate of the thin film transistor, and
   a driver circuit for driving the gate signal line,
   wherein the dummy pixel area includes:
      a dummy gate signal line parallel to the gate signal line of the thin film transistor, and
      a semiconductor layer of each of the dummy pixels intersecting with the dummy gate signal line via an insulating layer,
   wherein the driver circuit includes a dummy circuit that is configured to output a scanning signal to the dummy gate signal line and an elementary circuit that is configured to output a scanning signal to the gate signal line,
   wherein the scanning signal output from the dummy circuit is transferred to the elementary circuit via the dummy gate signal line, and
   wherein just one electrode is connected to the semiconductor layer of each of the dummy pixels.

2. The display device according to claim 1, wherein the just one electrode is an image data signal line to which image data to be displayed in the display area is applied.

3. The display device according to claim 1, wherein the dummy gate signal line is formed in a same layer as the gate signal line of the thin film transistor in the display area so as to have a same width as the gate signal line of the thin film transistor in the display area, and
   the semiconductor layer of the dummy pixel is formed in a same layer as a semiconductor layer of the thin film transistor in the display area so as to have a same width as the semiconductor layer of the thin film transistor in the display area in a part in which the semiconductor layer of the dummy pixel intersects with the dummy gate signal line.

4. The display device according to claim 1, wherein in a field of vision perpendicular to a display surface of the display area, an area of a region where the dummy pixel is formed is smaller than an area of a region where the thin film transistor is formed in the display area.

5. A display device comprising:
   a display area as an area having a plurality of pixels each including a thin film transistor, and adapted to display an image;
   a dummy pixel area formed outside the display area, and having a plurality of dummy pixels,
   a gate signal line electrically connected to a gate of the thin film transistor, and
   a driver circuit for driving the gate signal line,
   wherein the dummy pixel includes;
      a dummy gate signal line parallel to a gate signal line of the thin film transistor, and
      a semiconductor layer intersecting with the dummy gate signal line via an insulating layer,
   the driver circuit includes a dummy circuit that is configured to output a scanning signal to a dummy gate signal line and an elementary circuit that is configured to output a scanning signal to the gate signal line,
   the scanning signal output from the dummy circuit is transferred to the elementary circuit via the dummy gate signal line,
   just one conductor layer is connected to the semiconductor layer,
   the dummy pixel area further includes a dummy pixel electrode formed in a same layer as a pixel electrode to which an image data signal is applied via the thin film transistor in the pixel in the display area, and
   the dummy pixel electrode is electrically connected to a common electrode forming a pair with the pixel electrode to control an orientation of a liquid crystal.

6. The display device according to claim 1, wherein the semiconductor layer of the thin film transistor and the dummy pixel is formed of low-temperature polysilicon.

7. The display device according to claim 1, wherein an orientation of a liquid crystal is controlled using an in-plane switching (IPS) method.

8. A display device comprising:
   a display area including a plurality of pixels each including a thin film transistor, and configured to display an image;
   a dummy pixel area formed outside the display area, and including a plurality of dummy pixels,
   a gate signal line electrically connected to a gate of the thin film transistor, an image data signal line supplying image data to the pixel, and a driver circuit for driving the gate signal line,
wherein the dummy pixel area includes:
  a dummy gate signal line formed along the gate signal line extending direction,
  a semiconductor layer of each of the dummy pixels that intersects with the dummy gate signal line via an insulating layer,
wherein the driver circuit includes a dummy circuit that is configured to output a scanning signal to the dummy gate signal line and an elementary circuit that is configured to output a scanning signal to the gate signal line,
the scanning signal output from the dummy circuit is transferred to the elementary circuit via the dummy gate signal line, and
only the image data signal line is electrically connected to the semiconductor layer of each of the dummy pixels.

9. The display device according to claim 8, wherein
the dummy gate signal line is formed in a same layer as the gate signal line of the thin film transistor in the display area so as to have a same width as the gate signal line of the thin film transistor in the display area.

10. The display device according to claim 8, wherein
the semiconductor layer of the dummy pixel is formed in a same layer as a semiconductor layer of the thin film transistor in the display area so as to have a same width as the semiconductor layer of the thin film transistor in the display area in a part in which the semiconductor layer of the dummy pixel intersects with the dummy gate signal line.

11. The display device according to claim 8, wherein
an area of a region where the dummy pixel is formed is smaller than an area of a region where the thin film transistor is formed in the display area.

12. The display device according to claim 8, wherein
the dummy pixel area further includes a dummy pixel electrode formed in a same layer as a pixel electrode to which an image data signal is applied via the thin film transistor in the pixel in the display area, and
the dummy pixel electrode is not connected to the semiconductor layer of the dummy pixel.

13. The display device according to claim 8, wherein
the semiconductor layer of the thin film transistor and the dummy pixel is formed of low-temperature polysilicon.

14. The display device according to claim 8, wherein
an orientation of a liquid crystal is controlled using an in-plane switching method.

15. The display device according to claim 1,
wherein, in each of said pixels in said display area, a drain of the thin film transistor is connected to an image data signal line and a source of the thin film transistor is connected to a source line, and
wherein, in each of said dummy pixels, the semiconductor layer of the dummy pixel is connected to the image data signal line, serving as said just one electrode, but is not connected to the source line.

16. The display device according to claim 8,
wherein, for each of said dummy pixels, the image signal line is the only electrode to which the semiconductor layer is connected.

17. The display device according to claim 8,
wherein, in each of said pixels in said display area, a drain of the thin film transistor is connected to an image data signal line and a source of the thin film transistor is connected to a source line, and
wherein, in each of said dummy pixels, the semiconductor layer of the dummy pixel is connected to the image data signal line, but is not connected to the source line.

* * * * *